(12) United States Patent
Holz et al.

(10) Patent No.: US 12,342,466 B2
(45) Date of Patent: Jun. 24, 2025

(54) METHOD FOR PRODUCING A PRINTED CIRCUIT BOARD, AND PRINTED CIRCUIT BOARD HAVING AT LEAST ONE EMBEDDED ELECTRONIC COMPONENT

(71) Applicant: UNIMICRON GERMANY GMBH, Geldern (DE)

(72) Inventors: Oliver Holz, Kamp-Lintfort (DE); Manuel Schumann, Wesel (DE); Dieter Köhler, Issum (DE)

(73) Assignee: UNIMICRON GERMANY GMBH, Geldern (DE)

( * ) Notice: Subject to any disclaimer, the term of this patent is extended or adjusted under 35 U.S.C. 154(b) by 132 days.

(21) Appl. No.: 18/027,134

(22) PCT Filed: May 11, 2022

(86) PCT No.: PCT/EP2022/062779
§ 371 (c)(1),
(2) Date: Mar. 20, 2023

(87) PCT Pub. No.: WO2022/243132
PCT Pub. Date: Nov. 24, 2022

(65) Prior Publication Data
US 2023/0337363 A1    Oct. 19, 2023

(30) Foreign Application Priority Data
May 18, 2021    (DE) .................... 10 2021 112 814.5

(51) Int. Cl.
*H05K 1/18* (2006.01)
*H05K 3/42* (2006.01)
*H05K 3/46* (2006.01)

(52) U.S. Cl.
CPC ............ *H05K 1/188* (2013.01); *H05K 3/425* (2013.01); *H05K 3/4644* (2013.01)

(58) Field of Classification Search
CPC .......... H05K 1/18; H05K 1/188; H05K 3/425; H05K 3/4644; H05K 3/46; H05K 3/42
(Continued)

(56) References Cited

U.S. PATENT DOCUMENTS

2009/0041994 A1    2/2009  Ockenfuss et al.
2009/0084596 A1    4/2009  Inoue et al.
(Continued)

FOREIGN PATENT DOCUMENTS

DE    102017220175 A1    5/2019
EP       1 900 264 B1    5/2013

*Primary Examiner* — Tremesha W Burns
(74) *Attorney, Agent, or Firm* — Calderon Safran & Wright P.C.; David S. Safran

(57) ABSTRACT

A method for producing a printed circuit board having at least one embedded electronic component, in which a support layer and a positioning layer having a recess somewhat larger than the corresponding base area of the printed circuit board module are provide, the positioning layer is placed on the support layer and the printed circuit board module inserted into the recess in the positioning layer. The printed circuit board module is positioned without soldering or gluing, and at least one electrically insulating layer placed on the printed circuit board module and the positioning layer surrounding the printed circuit board module. An electrically conductive layer is placed on the at least one electrically insulating layer covering the printed circuit board module, and the layer sequence is pressed. The bores in the pressed layer sequence are metallized.

18 Claims, 3 Drawing Sheets

(58) Field of Classification Search
USPC .......................................................... 361/761
See application file for complete search history.

(56) References Cited

U.S. PATENT DOCUMENTS

2019/0320534 A1  10/2019  Degrenne et al.
2021/0112666 A1   4/2021  Moitzi et al.

METHOD FOR PRODUCING A PRINTED CIRCUIT BOARD, AND PRINTED CIRCUIT BOARD HAVING AT LEAST ONE EMBEDDED ELECTRONIC COMPONENT

BACKGROUND OF THE INVENTION

Field of the Invention

The invention relates to a method for producing a printed circuit board with at least one embedded electronic component, and to a printed circuit board with at least one embedded electronic component.

Description of the Related Art

Electrical circuit boards, sometimes referred to as printed electrical circuits, have been used for many decades in electrical devices, machines, systems and also motor vehicles as carriers of electronic components. These are usually rigid printed circuit boards that electrically interconnect discrete components and highly integrated components on the one hand, and act as carriers of the same on the other. The printed circuit boards usually consist of one or more individual layers, which are copper-clad on one or both sides to form conductor tracks or conductor patterns. In multi-layer printed circuit boards, the individual layers or the conductor tracks arranged on the individual layers are electrically connected to one another by metallized bores in the printed circuit board.

Since the number of electrical and electronic components to be arranged on a printed circuit board is constantly increasing and less and less space is available for printed circuit boards, there has been a need for several years to enable ever greater integration and packing density on printed circuit boards. In order to increase the number of electronic components that can be arranged on a printed circuit board of a determined size, electronic components have been developed with ever smaller component shapes and smaller pitch dimensions of the connections. However, even these measures are now often insufficient to enable all the required electronic components to be arranged on the two outer layers of a printed circuit board.

For this reason, electrical or electronic components have been arranged or embedded not only on the two outer layers of a printed circuit board but also inside the printed circuit board for some years now. These are active or passive electronic components or parts, for example, semiconductors or resistors, inductors and capacitors, which are integrated into the printed circuit board. By embedding the electronic components in the printed circuit board, the number of electronic components per printed circuit board can be further increased. Furthermore, embedding components in a printed circuit board has the advantage that the components are protected from environmental influences and against high voltages. Furthermore, embedding also improves the thermal connection and shielding of the components, so that the corresponding EMC requirements can be better met.

However, the arrangement or embedding of the electronic components in the printed circuit board is associated with increased effort in the production of the printed circuit board.

In a method known from practice for producing a printed circuit board with an embedded electronic component, the component is first bonded to a structured printed circuit board core using a conductive adhesive. The printed circuit board core thus assembled is then pressed to form a multi-layer before further process steps follow, which are common in the production of multi-layer printed circuit boards. This method uses bare electronic components (bare dies) whose connection pads are coated with a gold layer to ensure adequate electrical contact.

A similarly constructed printed circuit board is known from U.S. Patent Application 2009/0084596 A1. Here, a core layer in which a recess is formed is first placed on a support layer which has a resin layer. To fix the core layer to the support layer, the support layer is heated to a temperature of 40 to 60° C., at which the resin used softens. A bare electronic component is then inserted into the recess of the core layer, and the support layer is again heated to a temperature of 40 to 60° C. to fix the component to the support layer. Thereafter, an unhardened resin layer is pressed onto the surface of the core layer, and the resin layer is heated to a temperature of up to 150 to 180° C. so that the electronic component placed in the recess is surrounded by the resin.

To contact the electronic component embedded in this way, bores are made with a laser from the top of the resin layer covering the core layer and the electronic component to the electronic component and then metallized. The top surface of the resin layer facing away from the core layer has a copper foil, which can be patterned by etching to create corresponding connection surfaces.

In another known method for embedding electronic components in printed circuit boards, standard SMD components are used which are first soldered onto a structured printed circuit board core using the reflow method. The assembled core is then pressed to form a multi-layer before further method steps in the production of the printed circuit board follow.

However, these known methods have the disadvantage that the component must be glued or soldered or the support layer must be heated in order to position the electronic component before proceeding with the assembly of the printed circuit board.

SUMMARY OF THE INVENTION

The object of the present invention is to provide a method by which printed circuit boards having at least one embedded electronic component can be produced simply and reliably. In addition, a printed circuit board having at least one embedded electronic component is to be specified which can be produced simply.

This object is achieved with a method according to patent claim 1 and the printed circuit board according to the present invention in that the electronic component is already embedded in a prefabricated printed circuit board module during the construction of the printed circuit board, wherein the prefabricated printed circuit board module has at least one electrically conductive layer and at least one electrically insulating layer, wherein the electrically insulating layer surrounds the electronic component and the contacts of the electronic component are conductively connected to connection surfaces of the at least one electrically conductive layer.

The method according to the invention is characterized by the following steps: providing a support layer,
  providing a positioning layer having a recess larger than the corresponding base area of the printed circuit board module,
  placing the positioning layer on the support layer, inserting the printed circuit board module into the recess in the positioning layer, placing at least one electrically insulating layer on the printed circuit board module and the positioning layer surrounding the printed circuit board module, placing an electrically conductive layer on the at least one electrically insulating layer covering the printed circuit board module, pressing the layer sequence produced in this manner, making bores in the pressed layer sequence in the area of the connection surfaces of the printed circuit board module up to at least the connection surfaces, and metallizing the bores.

The printed circuit board produced by the method according to the invention differs first of all substantially from known printed circuit boards with embedded electronic components in that the electronic component is embedded in a printed circuit board module. The electronic component itself may be designed as an unencapsulated electronic component (bare dies) arranged in an insulating single layer, wherein an electrically conductive layer, for example a copper foil, is applied to the upper side and/or to the lower side of the single layer. The insulating layer or single layer may be a base material, for example a composite material consisting of a thermoset and a reinforcing material based on different types of glass fiber fabric. The base laminate may be, for example, an FR4 (flame retardant, glass epoxy) base laminate, as has been used extensively in the manufacture of printed circuit boards for many years.

The electrical connection between the contacts of the electronic component and at least one electrically conductive layer or the connection surfaces designed on the conductive layer can be made in different ways. Contacting is possible both via metallized holes and via individual conductors or wires introduced into the insulating middle layer. Such printed circuit board modules with embedded electronic components are offered by various manufacturers of electronic components.

As has been previously explained, the printed circuit board module has at least one electrically conductive layer and at least one electrically insulating layer. Preferably, the printed circuit board module has two outer electrically conductive layers, between which the at least one electrically insulating layer is arranged as a middle layer. The electrically insulating layer can itself be composed of several electrically insulating individual layers, which are preferably joined together by pressing during the manufacture of the printed circuit board module. However, the specific design of the printed circuit board module and, in particular, the type of electrical connection in the printed circuit board module is not of particular importance within the scope of the present application.

The embedded printed circuit board module is contacted via metallized holes which extend at least as far as the connection surfaces of the printed circuit board module. The connection surfaces can be arranged on only one side of the printed circuit board module or on both sides of the printed circuit board module, even in the case of two outer electrically conductive layers.

In the method according to the invention, soldering or bonding of the printed circuit board module inserted in the recess in the positioning layer can be omitted. It is also not necessary to heat the support layer before or during insertion of the printed circuit board module. Instead, the printed circuit board module can be positioned simply by inserting it into the corresponding recess in the positioning layer. For this, the dimensions of the recess in the positioning layer are adapted to the outer dimensions of the printed circuit board module, i.e. the recess is only slightly larger than the printed circuit board module in the not yet pressed state.

The recess in the positioning layer is dimensioned in such a way that, after insertion of the printed circuit board module into the recess, the lateral distance a between the printed circuit board module and the positioning layer surrounding the printed circuit board module is as small as possible to allow accurate positioning. For this purpose, there is a defined distance a between the inserted printed circuit board module and the at least one insulating layer surrounding the printed circuit board module in the not yet pressed state, which is selected such that both a sufficiently simple insertion of the printed circuit board module into the recess and a secure positioning of the printed circuit board module in the recess after pressing are ensured.

The distance is selected only so large that the gap between the edge of the recess and the electronic component can be filled during pressing. The distance is preferably less than 0.5 mm, in particular less than 0.3 mm. To allow sufficiently easy insertion of the printed circuit board module into the recess, the distance on the other side is preferably at least 0.1 mm, in particular about 0.2 mm, which means that both criteria can be met very well.

The insertion of the electronic components into the recess can be carried out both manually and automatically, for example if several printed circuit boards are produced simultaneously in a corresponding panel. The individual printed circuit boards can be assembled, for example, by positioning the individual layers one above the other in a registration system. For precise positioning of the individual layers one above the other, corresponding recesses can be formed in the edge region of the individual layers or panels.

In the method according to the invention, the layers of the printed circuit board are placed one on top of the other, and in an intermediate step the printed circuit board module to be embedded is inserted into the recess of the positioning layer and thereby placed on the support layer. The printed circuit board module inserted in this way is then covered by at least one electrically insulating layer before an outer electrically conductive layer is applied as the upper layer. The sequence of layers produced in this way with the embedded printed circuit board module is then pressed, fixing the printed circuit board module in position and at the same time mechanically bonding the individual layers of the printed circuit board together. Of course, more than one printed circuit board module can be embedded in a printed circuit board. The positioning layer then has a number of recesses corresponding to the number of printed circuit board modules to be embedded, each of which is adapted to the outer dimensions of the individual printed circuit board modules.

For electrical contacting of the embedded electronic component, bores are then made in the pressed layer sequence in the area of the connection surfaces of the printed circuit board module. The bores have at least such a depth to drill into the connection surfaces. This ensures that good electrical connection of the individual connection surfaces is guaranteed during subsequent metallization of the bores.

The bores made in the printed circuit board are preferably blind bores that penetrate a few micrometers into the connection surfaces. In addition, however, the bores could also be formed as through-bores, in which case the electrical connection of the connection surfaces to the at least one outer electrically conductive layer is also achieved by metallizing the bores.

That the electronic component is embedded in the printed circuit board modules and, thus, also in the printed circuit board not only makes it possible to achieve a higher packing density of the printed circuit board, but also to improve the dissipation of heat generated in the component via the material immediately surrounding the component. This leads to increased performance of the component. Embedding the component also has the advantage that the circuit implemented by the printed circuit board is not immediately recognizable, so that improved protection against plagiarism is provided.

In the printed circuit board according to the invention, the support layer initially serves as the lowest layer in the construction of the printed circuit board, so that the support layer should have sufficient stability. The support layer may be an insulating layer, such as a hardened base material. The base material can be a composite material consisting of a thermoset and a reinforcing material based on different types of glass fiber fabric. If the support layer consists of an electrically insulating material, the bores are made in the layer sequence from the upper, electrically conductive layer, so that the bores extend through the electrically conductive layer and the at least one electrically insulating layer covering the printed circuit board module to at least the connection surfaces of the printed circuit board module.

According to a preferred embodiment of the method according to the invention and of the printed circuit board according to the invention, the support layer has an electrically conductive layer and an electrically insulating layer. In this case, the electrically insulating layer is arranged between the electrically conductive layer and the printed circuit board module or the positioning layer, so that the electrically conductive layer forms the outer, lower layer. In this preferred design, the printed circuit board thus has two electrically conductive layers as outer layers, which may in particular be copper foils. Also in such a design of the printed circuit board, the bores can be made in the layer sequence from only one side, although in this case the bores can be made from both the top side and the bottom side, since both the top side and the bottom side are formed by an electrically conductive layer, so that in both cases it is possible to connect the connection surfaces via the metallized bores with an outer electrically conductive layer. If the support layer has an electrically conductive layer, at least some of the bores can also extend through the support layer.

In particular, in the case where the printed circuit board module has an electrically conducting layer and at least one connection surface both on its top side and on its bottom side, it is provided that bores are made in the pressed layer sequence from both sides, i.e. both from the top side and from the bottom side, in the area of the connection surfaces, each of which bore extends at least to the connection surfaces. The bores each have at least such a depth that the upper side of the connection surfaces facing the respective electrically conductive layer is reached and drilled. The individual connection surfaces are preferably contacted from the side of the layer sequence from which the connection surface is at a smaller distance, so that the bores to be made have as little depth as possible.

In the printed circuit board according to the invention, the positioning layer serves to position a printed circuit board module during production of the printed circuit board. The recess in the positioning layer, into which the printed circuit board module is inserted before pressing, determines the position of the printed circuit board module so precisely that, when the bores are made after pressing, it is ensured that the connection surfaces are contacted with the bores. The positioning layer thus positions the inserted printed circuit board module and fixes it in position.

In principle, the positioning layer can comprise a single electrically insulating layer whose thickness is then adapted to the thickness of the printed circuit board module. According to a preferred design, however, the positioning layer has at least two electrically insulating layers, wherein the electrically insulating layers each have a recess for the printed circuit board module. By using at least two insulating layers for the positioning layer, it is possible to select the two layers in such a way that both the positioning of the printed circuit board module during insertion and the fixing of the printed circuit board module during pressing can be carried out optimally. In particular, two layers that are differently rigid or hardened can be used for this purpose. Preferably, a pre-preg is used for at least one electrically insulating layer of the positioning layer and a hardened base laminate is used for at least one electrically insulating layer of the positioning layer.

A prepreg is generally considered to be a resin-impregnated fiberglass fabric that has dried but not yet hardened. By using at least one prepreg as an insulating layer, sufficient resin, mostly epoxy resin, is available when the finished layer sequence is pressed, so that the printed circuit board module inserted into the recess of the positioning layer is fixed in position. In addition, the use of at least one prepreg also improves the mechanical bonding between the individual layers. According to a preferred design, a prepreg is therefore also used for the insulating layer covering the printed circuit board module and possibly also for the insulating layer of the support layer.

The hardened base laminate used for at least a second insulating layer of the positioning layer, as compared to the non-hardened prepreg, serves to ensure sufficient stability of the printed circuit board and to ensure secure positioning of the printed circuit board module to be embedded in the recess of the positioning layer before pressing. The hardened base laminate can be a composite material consisting of a thermoset and a reinforcing material of glass fiber fabric. The base laminate can be, for example, a known FR4 base laminate as used in the production of printed circuit boards.

For both the prepreg and the hardened base laminate, other suitable materials can be used in addition to glass fiber fabrics impregnated with epoxy resin, for example thermosets with a high Tg value (glass transition temperature value). To achieve the advantages described above, at least one insulating layer should not yet be hardened and at least one insulating layer of the positioning layer should be hardened.

If the positioning layer has several electrically insulating layers, each of which has a corresponding recess, these are placed one after the other on the first, lower insulating layer during production of the positioning layer. The recesses formed in the individual electrically insulating layers are adapted in each case to the corresponding outer dimensions of the printed circuit board module, wherein the recess is always selected to be somewhat larger than the corresponding outer dimensions. In particular, the uppermost insulating layer can have a larger recess than the electrically insulating layer arranged below it. Alternatively, however, the recesses designed in the individual electrically insulating layers may have recesses of the same size.

The electrically insulating layers of the positioning layer need not consist entirely of insulating material. For example, it is possible that at least one electrically conductive section, in particular at least one conductor track, is arranged on the underside and/or the top side of at least one electrically insulating layer. Standard printed circuit boards can also be used as electrically insulating layers, in which corresponding conductor tracks are applied to the underside and/or the upper side.

If, as has been explained previously, a plurality of electrically insulating layers are arranged one above the other, each of which has a recess for the printed circuit board module, a prepreg is preferably used for at least one of these electrically insulating layers and a hardened base material is used for at least one other of the electrically insulating layers. If, for example, three electrically insulating layers are used, each of which has a recess, the middle insulating layer can preferably be made of a prepreg, while a cured base material is used for each of the two outer insulating layers.

According to an embodiment of the method according to the invention that is advantageous in terms of production technology, corresponding recesses are first made in a first step in the insulating layers of the positioning layer into which the printed circuit board module is inserted, so that these electrically insulating layers with the recess are prepared accordingly before the individual layers are placed one on top of the other. The recesses in the electrically insulating layers can be produced in particular by etching, milling, punching or laser cutting. Depending on the design of the recess, a combination of the methods described above is also possible.

In the printed circuit board or method according to the invention, the electrically conductive layers, which are usually copper foils, preferably have a thickness of at least 50 μm, preferably at least 75 μm, in particular about 105 μm. The use of relatively thick copper foils for the electrically conductive layers has the advantage that this makes it easy to produce a printed circuit board with relatively thick conductor tracks on the two outer sides. As a result, even larger currents can flow through the conductor tracks without any problems and without causing unacceptable heating of the conductor tracks and thus of the printed circuit board as a whole. The desired final thickness of the tracks can be further increased, for example, by galvanic copper plating up to the desired thickness.

Particularly in the production of a printed circuit board in which the finished conductor tracks have a thickness of at least 100 μm, the bores in the area of the connection surfaces of the electronic component are preferably drilled mechanically. The methods otherwise used in the production of printed circuit boards for making bores, such as lasering or etching, are, in contrast, less suitable than the method according to the invention. Preferably, the diameter of the bores is at least equal to the depth of the bores. By choosing a ratio of bore diameter to bore depth equal to or greater than 1, good metallization of the bores can be achieved.

For the electrical connection of the connection surfaces of the embedded printed circuit board module arranged in the interior of the printed circuit board to corresponding terminal areas on the surface of the printed circuit board formed by the electrically conductive layer, bores are made in the printed circuit board, as previously explained, which extend at least into the connection surfaces, the bore walls of the bores subsequently being metallized. To produce the contact pads on the surface of the printed circuit board, the electrically conductive layer is preferably structured accordingly. In detail, the following steps can be carried out:

printing of a plating resist,
galvanic copper plating up to the desired thickness,
deposition of a metal resist,
stripping of the plating resist and
etching of the connection surfaces.

It is not necessary that all of the aforementioned steps be performed to create the connection areas. For example, if the thickness of the electrically conductive layer is sufficiently large, the galvanic copper plating and thus the printing of the plating resist can be omitted.

In detail, there are multiple possibilities for designing and further developing the method or printed circuit board according to the invention. For this, reference is made both to the patent claims subordinate to the independent patent claims and to the following description of preferred embodiments with reference to the accompanying drawings.

DETAILED DESCRIPTION OF THE DRAWINGS

Figure 1A:
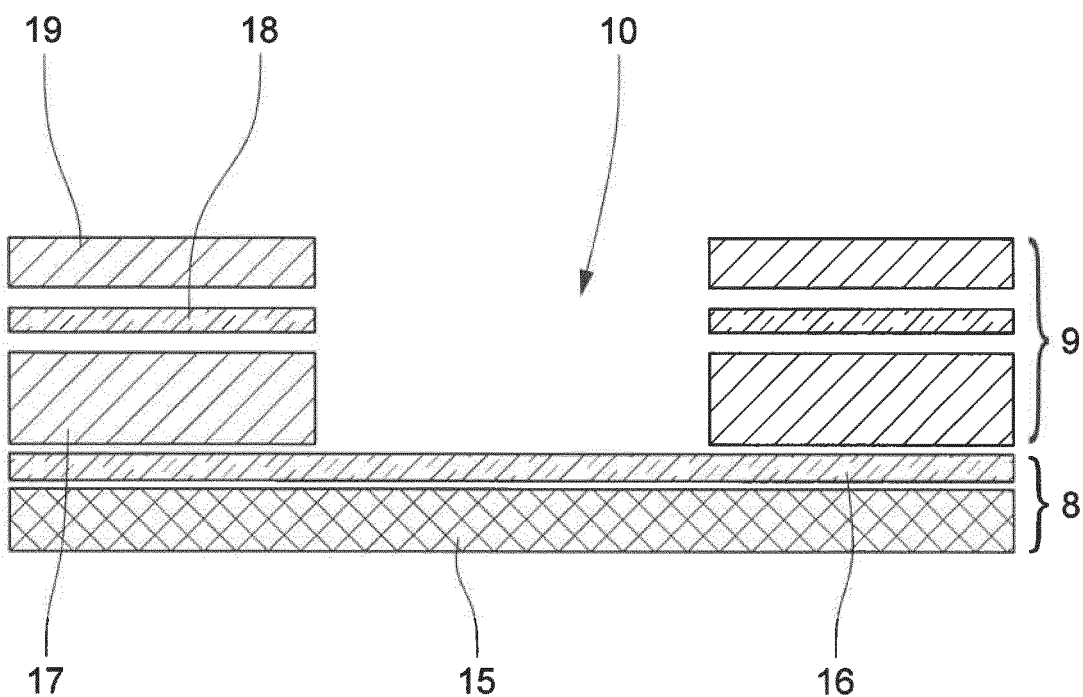
FIGS. 1a-1e are a schematic representation of individual steps of the method according to the invention for producing a printed circuit board with an embedded printed circuit board module.

In FIG. 1, five successive steps of the method for producing a printed circuit board 1 with an embedded electronic component 2 are shown schematically. The electronic component 2, which may in particular be a power semiconductor, is an electronic component which does not have an enclosure, i.e., a so-called "bare die".

The electronic component 2 is embedded in a printed circuit board module 3, for which purpose the printed circuit board module 3 is formed of two outer electrically conductive layers 4 and a central insulating layer 5 arranged in between. The electronic component 2 is surrounded by the electrically insulating layer 5, which may be a cured base laminate, in particular an FR4 base laminate. For electrical contacting of the electronic component 2, its contacts 6 are conductively connected to connection surfaces 7 of the electrically conductive layers 4, which are only indicated in the figures. However, the actual design of the printed circuit board module 3 and in particular the type of electrical connection between the contacts 5 of the electronic component 2 and the connection surfaces 7 on the conductive layers 4 can also be implemented differently.

The printed circuit board 1, shown schematically in FIGS. 1a-e, is produced by first placing the individual layers described in more detail below on top of one another. For this, the individual layers are positioned one above the other on a corresponding table, wherein the table has corresponding devices which ensure that the individual layers are positioned precisely one above the other. For this, upwardly projecting pins can be arranged on the table and corresponding recesses can be formed in the edge region of the individual layers so that the layers can be pushed with the recesses over the pins on the table and thus the individual layers can be positioned accurately.

In the method according to the invention, a support layer 8 is first positioned or provided accordingly, on which a positioning layer 9 is arranged, which has a recess 10 that is larger than the corresponding base area of the printed circuit board module 3. In the embodiment shown in FIG. 1a, the support layer 8 in turn is formed of two layers, namely a lower, electrically conductive layer 15 and an electrically insulating layer 16 arranged above it. The positioning layer 9 in the present case is formed of three electrically insulating layers 17, 18, 19, each of which has a recess 10, wherein the recesses 7 in the three lower insulating layers 17, 18, 19 are of the same size.

Figure 1B:
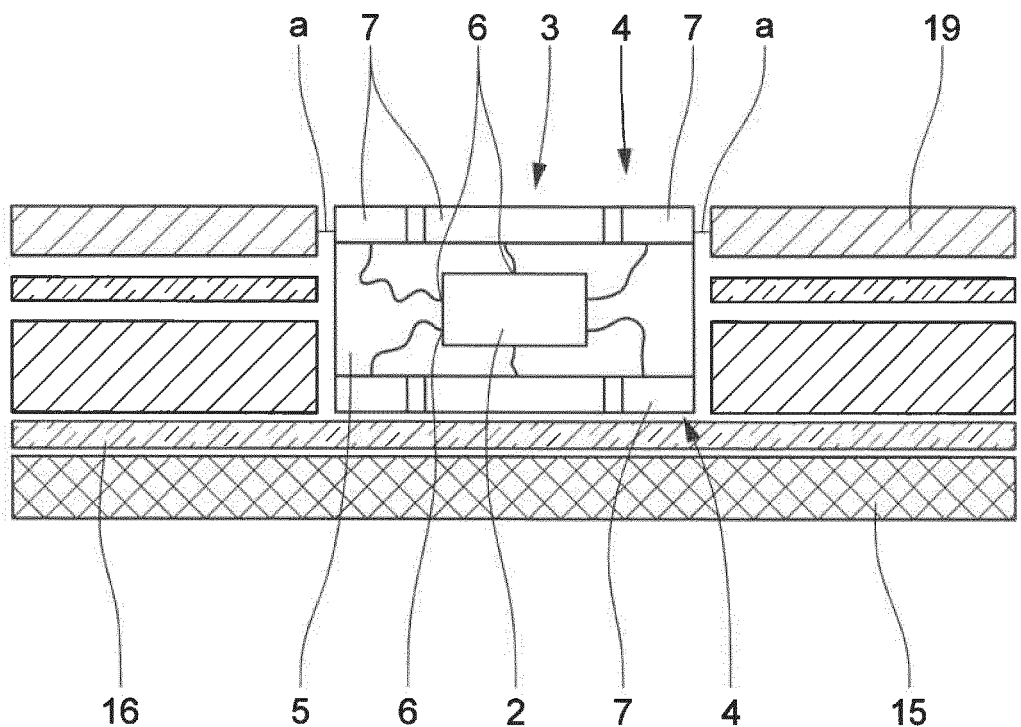

In a next process step, shown in FIG. 1b, the printed circuit board module 3 is inserted into the recesses 10 in the positioning layer 9 and the individual electrically insulating layers 17, 18, 19, respectively. The lateral distance a between the inserted printed circuit board module 3 and the insulating layer 17, 18, 19 surrounding the printed circuit board module 3 is selected in such a way that the printed circuit board module 3 can be inserted well into the recess 10 on the one hand, but is also positioned with sufficient positional accuracy on the other hand. As can be seen from FIG. 1b, this distance a is preferably at least approximately the same size on all sides and is preferably less than 0.3 mm, in particular 0.2 mm.

Figure 1C:
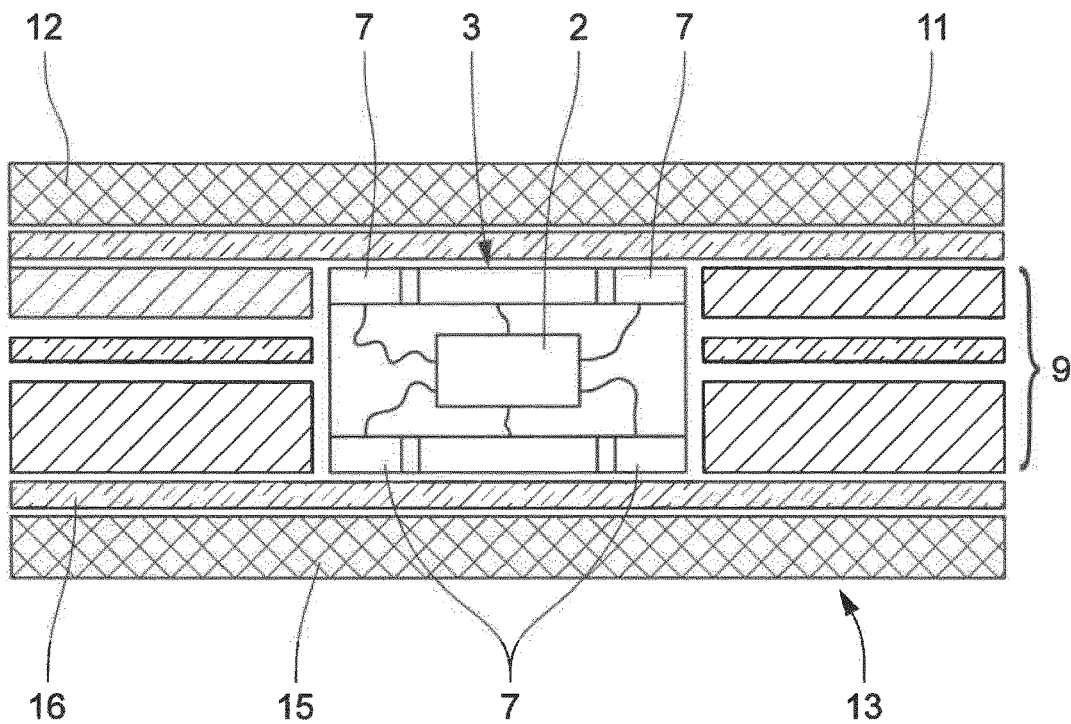

After the printed circuit board module 3 has been inserted into the recesses 10, a further insulating layer 11 is next placed on the printed circuit board module 3 and the top electrically insulating layer 19 of the positioning layer 9 surrounding the printed circuit board module 3, as shown in FIG. 1c. This insulating layer 11 has no recess and corresponds in its dimensions to the insulating layer 16 of the support layer 8. An electrically conductive layer 12 is then placed on the insulating layer 11 as the uppermost layer, which corresponds in its dimensions to the electrically conductive layer 15 of the support layer 8.

The two electrically conductive layers 12, 15 are, in particular, copper foils which have a thickness d of more than 50 μm, in particular about 105 μm. After the upper electrically conductive layer 12 has been positioned, the layer sequence 13 thus produced is pressed, whereby on the one hand the individual layers are bonded together, and on the other hand the gap surrounding the embedded printed circuit board module 3 at the side is also filled. For this, prepregs are used for the electrically insulating layers 11, 16 and 18, i.e. a glass fiber fabric impregnated with reactive resin which has dried but not yet hardened. When the layer sequence 13 is pressed, sufficient resin thus passes in particular from the prepregs into the space surrounding the embedded printed circuit board module 3, so that the printed circuit board module 3 is securely fixed in position.

Figure 1D:
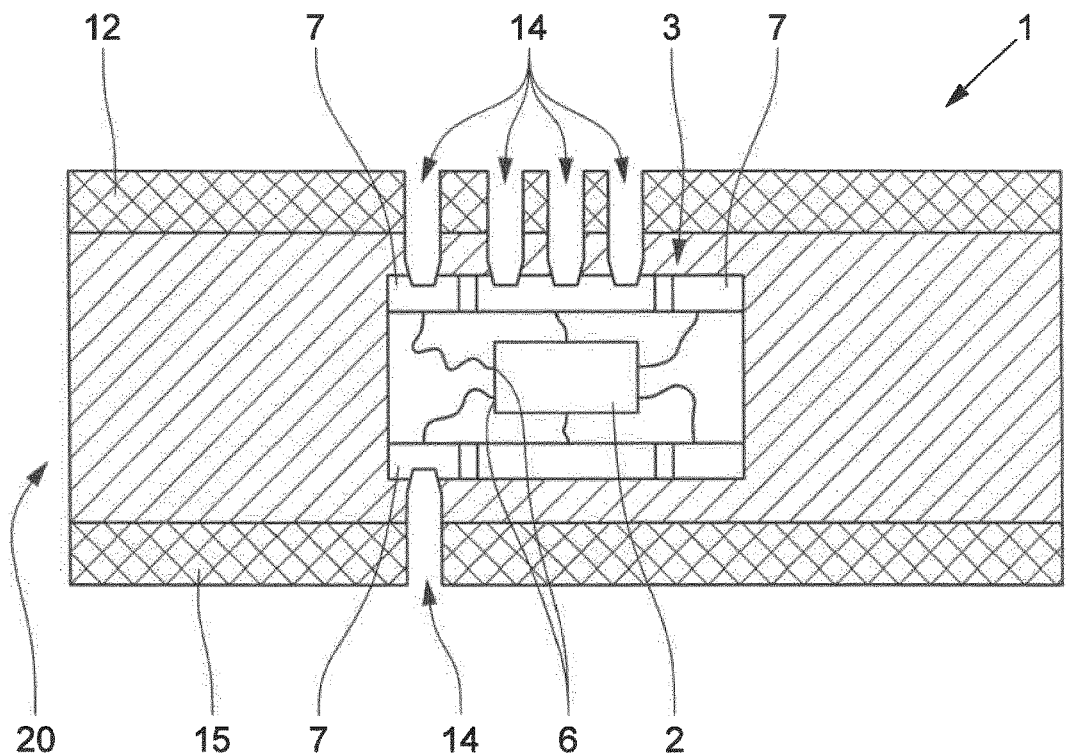

According to the illustration in FIG. 1d, the previously individual insulating layers 11, 16 and 17 to 19 are bonded together by pressing to form a common insulating layer 20. Next, bores 14 are made in the printed circuit board 1 previously produced by the pressing of the layer sequence 13 in the region of the connection surfaces 7 of the printed circuit board module 3, wherein the bores 14 pass through the upper electrically conductive layer 12 and the insulating layer 11 covering the printed circuit board module 3. In addition, in the embodiment shown, a bore 14 is also made in the layer sequence 13 extending from the support layer 8, that is, from the lower electrically conductive layer 15 through the insulating layer 16 to a connection surface 7 on the lower conductive layer 4 of the printed circuit board module 3. In this case, the bores 14 have a depth such that the connection surfaces 7 are each drilled on their upper side.

Figure 1E:
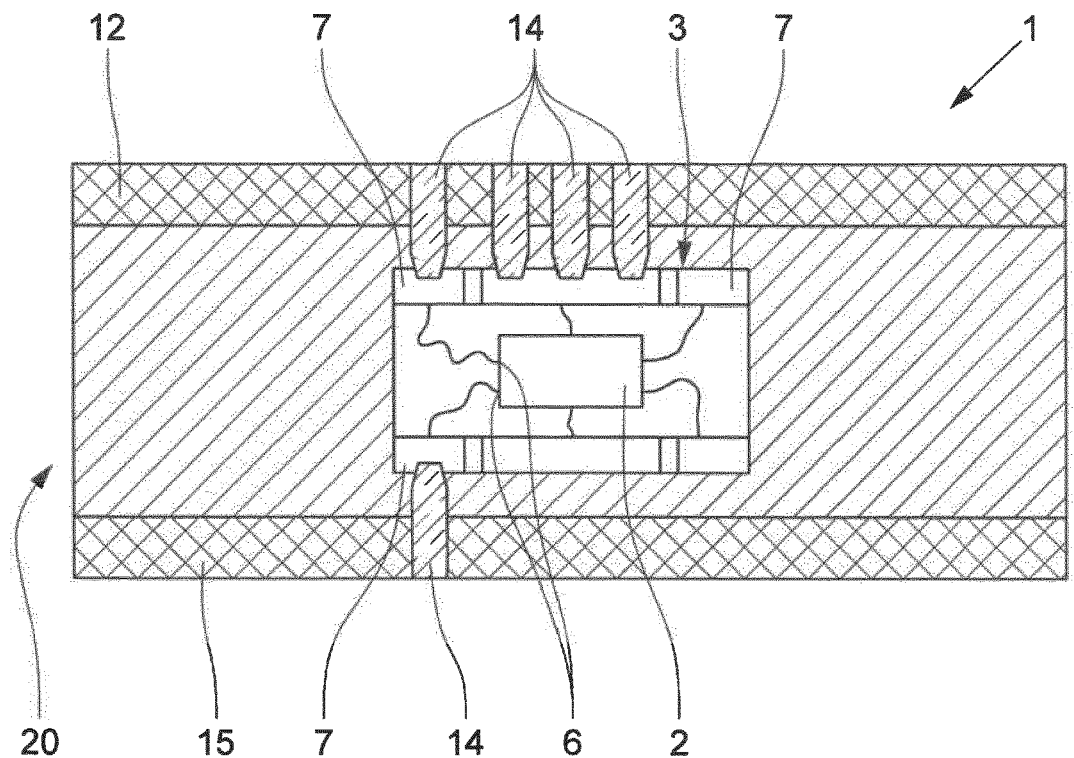

According to the last step shown in FIG. 1e, the bores 14 are then metallized, whereby the connection surfaces 7 of the embedded printed circuit board module 3 are bonded to the upper electrically conductive layer 12 or the lower electrically conductive layer 15. By having reached the surface of the connection surfaces 7 in the previous step, a secure electrical connection to the connection surfaces 7 is ensured via the metallized bores 14. At the same time that the bores 14 are metallized, corresponding connection areas are preferably created on the surface of the printed circuit board 1, i.e., the upper electrically conductive layer 12, for which the electrically conductive layer 12 is structured accordingly.

If the thickness of the electrically conductive layer 12 does not correspond to the desired target thickness of the connection areas or the conductor tracks, it can be increased to the desired target thickness by galvanic copper plating. Similar to the upper electrically conductive layer 12, the electrically conductive layer 15 of the support layer 8, which is the lower layer, can also be structured to produce corresponding connection areas and conductor tracks. Here, too, the thickness of the connection areas and conductor tracks can be further increased if necessary. These are methods known in the production of printed circuit boards, so they need not be explained further here.

Figure 2:
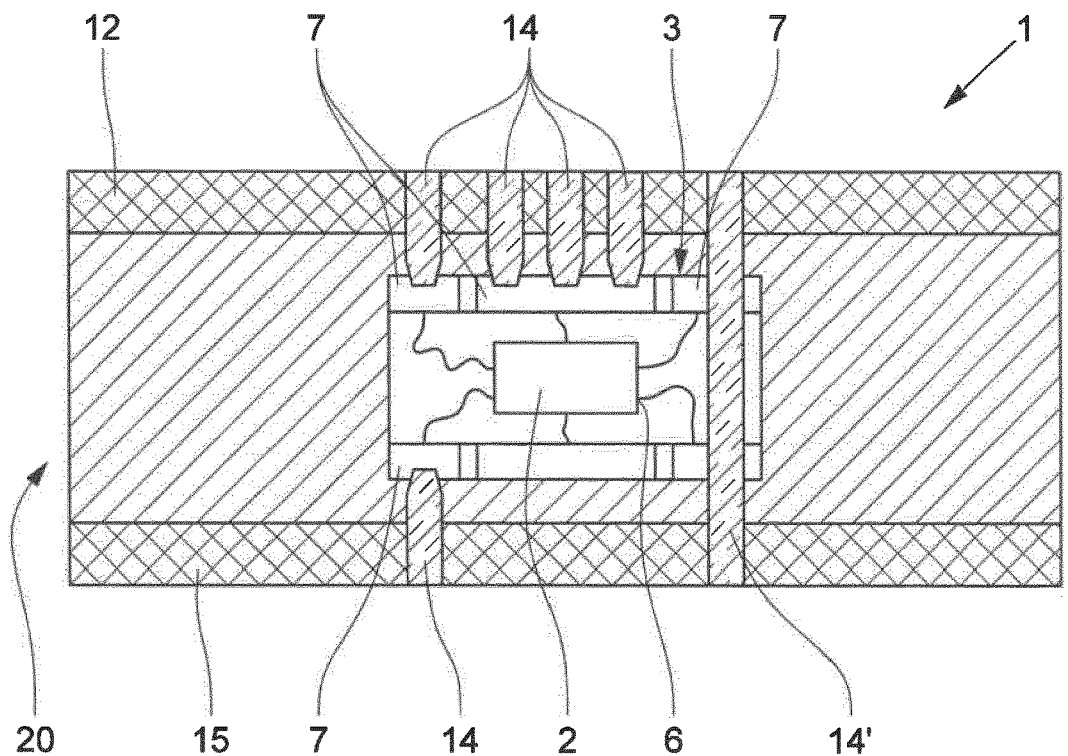
FIG. 2 shows a schematic representation of a second embodiment of a printed circuit board according to the invention.

FIG. 2 shows a second design of a printed circuit board 1 which is constructed and manufactured in almost exactly the same way as the printed circuit board 1 shown in FIGS. 1a-e. The only difference from the printed circuit board 1 as shown in FIG. 1e is that in addition to several metallized bores 14, which are designed as blind bores, a metallized bore 14' is now also provided in the printed circuit board 1, which is designed as a through bore. This metallized bore 14' extends both through the electrically conductive layers 12 and 15 and the insulating layers 11, 16 and 17 to 19 and also through the printed circuit board module 3, i.e., its two outer conductive layers 4 and its middle insulating layer 5.

REFERENCE NUMERALS

1. Printed circuit board
2. Electronic component
3. Printed circuit board module
4. Electrically conductive layers
5. Insulating layer
6. Contacts
7. Connection surfaces
8. Support layer
9. Positioning layer
10. Recess
11. Insulating layer
12. Electrically conductive layer
13. Layer sequence
14. Bore
15. Conductive layer
16. Insulating layer
17.-19 Insulating layers
20. Common insulating layer
a. Distance
d. Thickness

The invention claimed is:

1. A method for producing a printed circuit board having at least one embedded electronic component, having the following steps: producing a printed circuit board module having at least one electrically conductive layer and at least one electrically insulating layer, the at least one electrically insulating layer surrounding the electronic component so as to enclose it and the contacts of the electronic component being conductively connected to connection surfaces of the at least one electrically conductive layer, providing a support layer, providing a positioning layer having a recess larger than a corresponding base area of the printed circuit board module, placing the positioning layer on the support layer, inserting the printed circuit board module into the recess in the positioning layer, whereby the printed circuit board module is positioned without soldering or gluing, placing at least one electrically insulating layer on the printed circuit board module and the positioning layer surrounding the printed circuit board module, placing at least another electrically conductive layer on the at least one electrically insulating layer covering the printed circuit board module, pressing of a layer sequence produced by the preceding placing steps to form a pressed layer sequence, making bores in the pressed layer sequence in an area of the connection surfaces of the printed circuit board module extending to at least the connection surfaces, and metallizing the bores.

2. The method according to claim 1, wherein the recess in the positioning layer is dimensioned in such a way that, after insertion of the printed circuit board module into the recess, a lateral distance (a) between the printed circuit board module and the positioning layer surrounding the printed circuit board module is less than 0.5 mm.

3. The method according to claim 1, comprising the step of generating the bores into the pressed layer sequence in a region of the connection surfaces of the printed circuit board module by mechanical drilling.

4. The method according to claim 1, wherein the support layer has an electrically conductive layer and an electrically insulating layer, and wherein the electrically insulating layer is arranged between the electrically conductive layer and the printed circuit board module or the positioning layer.

5. The method according to claim 4, wherein at least part of the bores extends through the electrically conductive layer and the at least one electrically insulating layer covering the printed circuit board module, and/or that at least a part of the bores extends through the support layer.

6. The method according to claim 1, wherein the positioning layer has at least two electrically insulating layers, and wherein the electrically insulating layers each have a recess for the printed circuit board module.

7. The method according to claim 6, wherein a prepreg is used for at least one electrically insulating layer of the positioning layer and a hardened base laminate is used for at least one electrically insulating layer of the positioning layer.

8. The method according to claim 1, wherein the recesses in the electrically insulating layers of the positioning layer are made by etching, milling, punching or laser cutting.

9. The method according to claim 1, wherein the recess in the positioning layer is dimensioned in such a way that, after insertion of the printed circuit board module into the recess, a lateral distance (a) between the printed circuit board module and the positioning layer surrounding the printed circuit board module is less than about 0.2 mm.

10. A printed circuit board having at least one embedded electronic component, wherein the electronic component is arranged in a printed circuit board module and wherein the printed circuit board module has at least one electrically conductive layer and at least one electrically insulating layer, wherein the at least one electrically insulating layer surrounds the electronic component so as to enclose it and wherein the contacts of the electronic component are conductively connected to connection surfaces of the at least one electrically conductive layer, wherein the printed circuit board has at least the following layer sequence: a support layer, a positioning layer having a recess which is larger than the corresponding base area of the printed circuit board module, another electrically insulating layer, and another electrically conductive layer, wherein a printed circuit board module has been inserted into the recess in the positioning layer and positioned without soldering or gluing, the electrically insulating layer being located on the printed circuit board module with the positioning layer surrounding the printed circuit board module, the another electrically conductive layer covers the electrically insulating layer covering the printed circuit board module, a layer sequence produced of the above set forth layers having been pressed to create a pressed layer sequence, wherein metalized bores have been provided in the area of the connection surfaces of the printed circuit board module extending from at least one of the two outer layers of the layer sequence up to at least the connection surfaces.

11. The printed circuit board according to claim 10, wherein at least part of the bores extends through the electrically conductive layer and the at least one electrically insulating layer covering the printed circuit board module.

12. The printed circuit board according to claim 11, wherein the support layer comprises an electrically conductive layer and an electrically insulating layer, wherein the electrically insulating layer is arranged between the electrically conductive layer and the printed circuit board module or the positioning layer.

13. The printed circuit board according to claim 11, wherein at least some of the bores extend through the support layer.

14. The printed circuit board according to claim 10, wherein the positioning layer comprises at least two electrically insulating layers, and wherein the electrically insulating layers each have a recess for the printed circuit board module.

15. The printed circuit board according to claim 14, wherein at least one electrically conductive conductor track, is arranged on the underside and/or the top side of at least one electrically insulating layer of the positioning layer.

16. The printed circuit board according to claim 14, wherein the electrically insulating layer covering the printed circuit board module and at least one electrically insulating layer of the positioning layer are formed as prepreg, and/or at least one electrically insulating layer of the positioning layer is formed as a hardened base laminate.

17. The printed circuit board according to claim 11, wherein the bores have a diameter that is at least as large as the depth of the bores.

18. The printed circuit board according to claim 10, wherein at least one electrically conductive layer has a thickness (d) of at least 50 µm.

* * * * *